(12) United States Patent
Sugiyama et al.

(10) Patent No.: US 7,603,248 B2
(45) Date of Patent: Oct. 13, 2009

(54) TESTING CIRCUIT AND TESTING METHOD FOR SEMICONDUCTOR DEVICE AND SEMICONDUCTOR CHIP

(75) Inventors: Hidetoshi Sugiyama, Kawasaki (JP); Masao Nakajima, Kawasaki (JP); Haruyuki Mouri, Kawasaki (JP); Hideaki Suzuki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/474,393

(22) Filed: Jun. 26, 2006

(65) Prior Publication Data

US 2007/0203662 A1    Aug. 30, 2007

(30) Foreign Application Priority Data

Feb. 28, 2006    (JP)    .............................. 2006-054033

(51) Int. Cl.
    *G06F 19/00*    (2006.01)
(52) U.S. Cl. .................. 702/119; 702/120; 324/765
(58) Field of Classification Search ............. 702/81–84, 702/117, 119, 120, 123, 125; 438/130
    See application file for complete search history.

(56) References Cited

U.S. PATENT DOCUMENTS

| | | | |
|---|---|---|---|
| 4,446,475 A | 5/1984 | Gercekci | |
| 4,845,351 A | 7/1989 | Hara | |
| 5,059,899 A | 10/1991 | Farnworth et al. | |
| 5,655,113 A * | 8/1997 | Leung et al. | 713/401 |
| 5,899,703 A | 5/1999 | Kalter et al. | |
| 5,953,271 A * | 9/1999 | Ooishi | 365/201 |
| 5,981,971 A * | 11/1999 | Miyakawa | 257/48 |
| 6,365,443 B1 | 4/2002 | Hagiwara et al. | |
| 6,815,973 B1 * | 11/2004 | Conn | 324/765 |
| 2003/0067002 A1 | 4/2003 | Fischer et al. | |
| 2003/0179010 A1* | 9/2003 | Gerstmeier et al. | 326/37 |
| 2005/0212090 A1 | 9/2005 | Friedrich | |

FOREIGN PATENT DOCUMENTS

| | | | |
|---|---|---|---|
| JP | 01028863 A * | 1/1989 | |
| JP | 8-298273 A | 11/1996 | |
| JP | 2001-135597 A | 5/2001 | |
| JP | 2003 124275 | 4/2003 | |
| JP | 2003-124275 | * 4/2003 | |

OTHER PUBLICATIONS

European Search Report for EP 06 25 3423, dated Feb. 15, 2008, 9 pgs.

* cited by examiner

*Primary Examiner*—Manuel L Barbee
(74) *Attorney, Agent, or Firm*—Arent Fox LLP

(57) ABSTRACT

A testing circuit for a semiconductor device having a test mode in which the information about built-in memory cannot be read after conducting a test on a semiconductor device, and cutting a pad formed in a scribe area is provided. The scribe PAD and the scribe ROM are formed in the cutting area of a wafer. Upon power-up of a chip a, the power-on reset circuit transmits a reset signal to the mode register. After setting the initial resister value to "00", a mode switch signal is input from the mode switch terminal, the scribe ROM is activated, and the test mode is set. In this process, a Manchester coded signal is provided from the scribe PAD, decoded by a clock of dividing frequency provided from the clock dividing circuit, the value of the register in the test mode in the mode register is set, and external reset is asserted or negated.

13 Claims, 5 Drawing Sheets

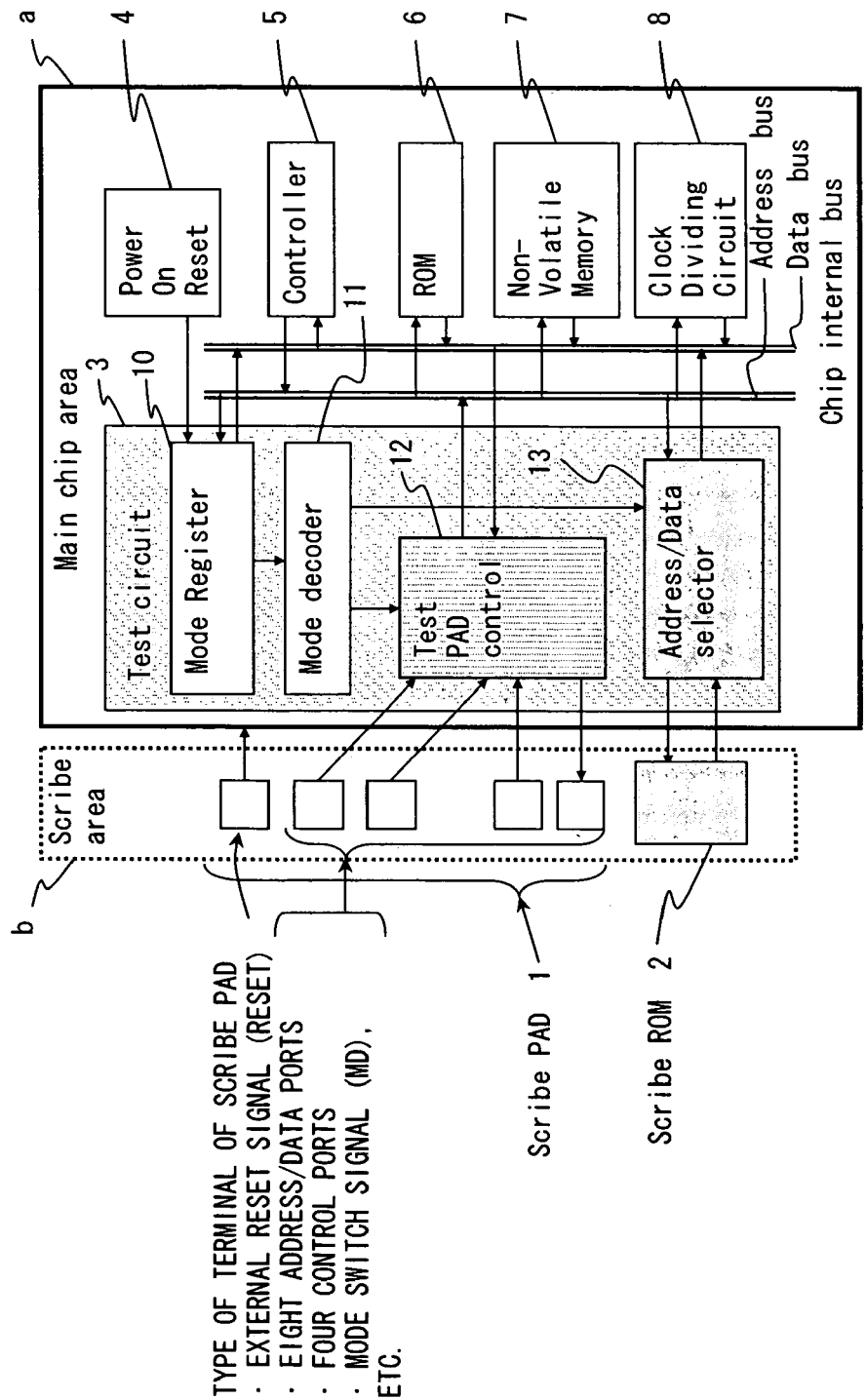
F I G. 1

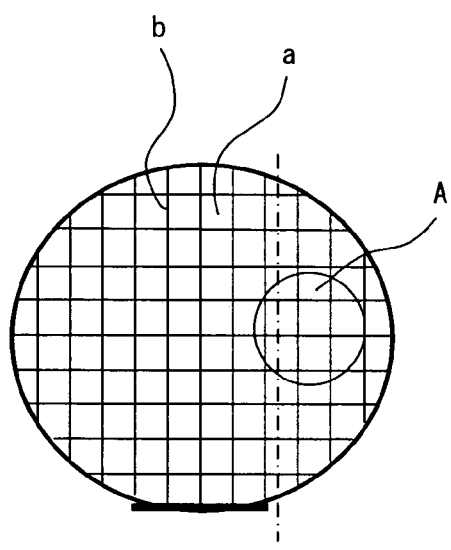
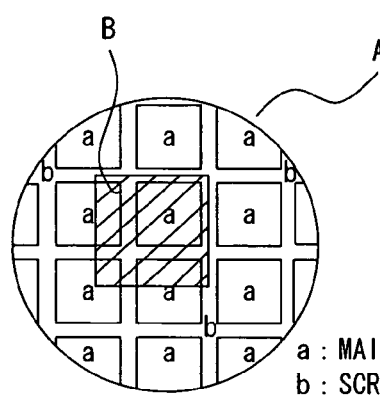
a : MAIN CHIP AREA
b : SCRIBE AREA
F I G. 2 A            F I G. 2 B a : MAIN CHIP AREA
b : SCRIBE AREA
▓ : CUT LINE

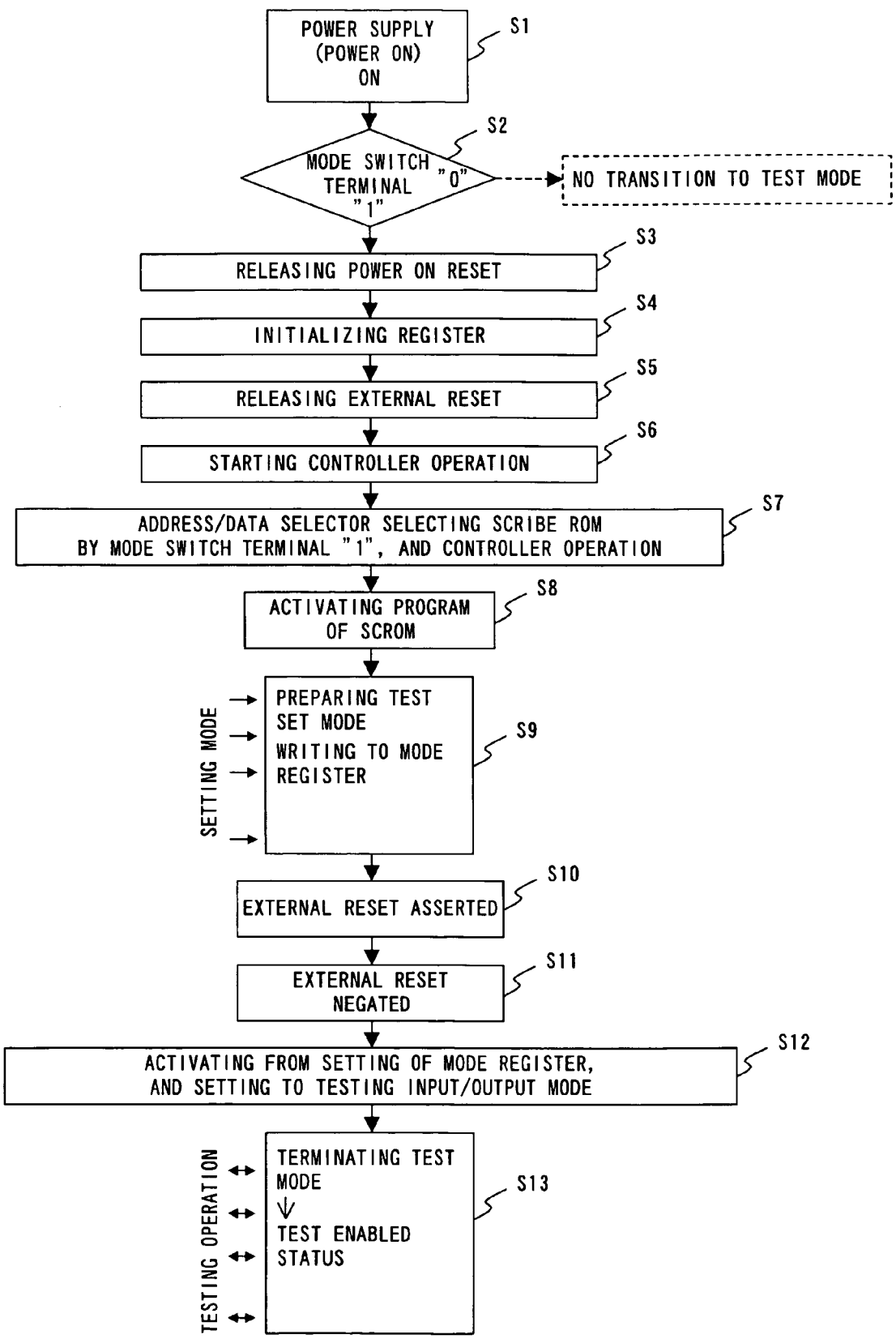
F I G. 4

US 7,603,248 B2

TESTING CIRCUIT AND TESTING METHOD FOR SEMICONDUCTOR DEVICE AND SEMICONDUCTOR CHIP

CROSS REFERENCE TO RELATED APPLICATION

This application is based upon and claims the benefit of priority from the prior Japanese Patent Application No. 2006-054033 filed on Feb. 28, 2006, the entire contents of which are incorporated herein by reference.

BACKGROUND OF THE INVENTION

1. Field of the Invention

The present invention relates to a testing circuit for a semiconductor device, and more specifically to a testing circuit, a testing method, and a semiconductor chip that make it hard to decrypt or falsify the data in a chip.

2. Description of the Related Art

A semiconductor device is used in various industrial fields and functions as the base of industries. It is very important to secure the reliability of the semiconductor device. Therefore, when conducting a test of a semiconductor device, it should include not only the operation test of a logic circuit, but also tests of the rewritable non-volatile memory, such as built-in EEPROM, flash memory, FeRAM (Ferroelectric Random Access memory), etc. In this case, a dedicated memory test mode is more appropriate than using a BIST (built-in self-test) circuit to test the memory requiring a special sequence for rewriting data.

Accordingly, so far a testing pad is formed in a chip, ROM with an application for setting a test mode is formed in a chip, and the ROM is accessed from the testing pad, thereby testing the memory and logic circuit in the chip.

The invention of Japanese Published Patent Application No. 2001-135597 (Japanese Patent Application Publication) discloses the technology for preparing a pad in a scribe area (cutting area) in which a semiconductor wafer is cut and then cutting the wafer after writing data on the storage area of the chip. This thereby separates the pad from the chip and prevents the decryption of data.

However, in the conventional testing method of storing a testing pad and ROM with an application for setting a test mode in a chip, it is possible for a third party to decrypt the memory and logic in the chip by accessing the ROM from the testing pad, thereby possibly causing what is called a security hole.

In the semiconductor device described in the Japanese Published Patent Application No. 2001-135597, the scribe pad is cut, but ROM remains in the chip, thereby failing to solve the above-mentioned problem.

SUMMARY OF THE INVENTION

The present invention provides a semiconductor device testing circuit which makes it difficult to decrypt or falsify data in a chip by cutting not only a testing pad, but also the ROM for setting a test mode after conducting a test of the semiconductor device, using a Manchester coded signal in synchronization with a predetermined clock of dividing frequency, and setting a test mode.

To solve the above-mentioned conventional problems, the present invention provides a testing circuit for a semiconductor device including: a pad formed in a cutting area of a semiconductor wafer; a storage device which is formed in a cutting area of the semiconductor wafer, and stores a test mode transition program; and a control circuit which is formed in a chip area of the semiconductor wafer, decodes a logic signal input from the pad, and sets a test mode by the program stored in the storage device.

With the above-mentioned configuration, the pad formed in the cutting area of the semiconductor wafer and the ROM is annihilated by dicing the semiconductor wafer, and after shipping a semiconductor integrated circuit (chip), the transition to a test mode is disabled, thereby preventing the decryption and falsification of data. The configuration also enables a decoding process to be performed using a logic signal of a Manchester coded signal, etc. and using a clock of dividing frequency generated based on a program stored in the storage device, and disables a test mode to be set after the shipping, thereby making it difficult to decrypt or falsify data.

Furthermore, for example, the control circuit consists of a mode register in which the test mode is set; a test pad control circuit for decoding the logic signal; and an address and data selector for switching access to the storage device. The initialization signal is supplied to the above-mentioned mode register by the power supply to the above-mentioned chip. Afterwards the mode switch signal is supplied, the program memorized in the storage device is started, and the test mode is set to the mode register.

BRIEF DESCRIPTION OF THE DRAWINGS

FIG. 1 shows a practical circuit configuration in a chip area;

FIG. 2A shows the entire configuration of a semiconductor wafer;

FIG. 2B is an enlarged view of FIG. 2A;

FIG. 4 is a flowchart explaining the process according to an embodiment of the present invention.

DESCRIPTION OF THE PREFERRED EMBODIMENTS

The embodiments according to the present invention are explained below by referring to the attached drawings.

FIGS. 2A and 2B are explanatory views of the present embodiment. FIG. 2A shows the configuration of the entire semiconductor wafer. FIG. 2B is an enlarged view of part A of FIG. 2A. As shown in FIGS. 2A and 2B, the semiconductor wafer consists of a main chip area (hereinafter referred to as a chip area) "a" including the storage area of data and a scribe area "b" where a chip is divided after testing the semiconductor wafer.

Figure 3A:
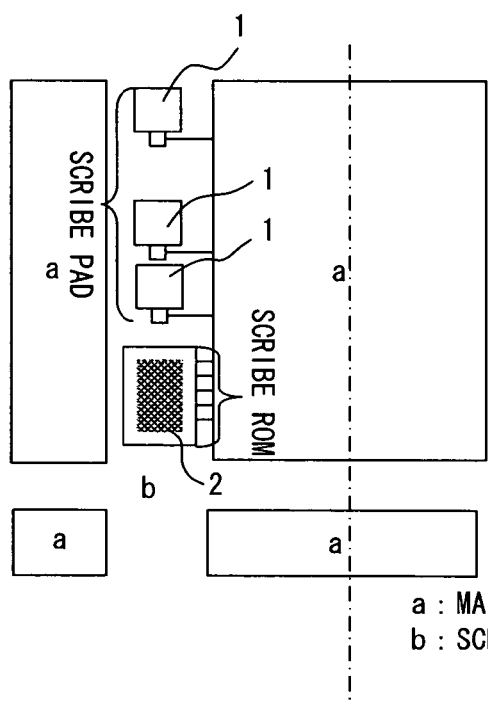
FIG. 3A is an enlarged view of FIG. 2B.

FIG. 3A is an enlarged view of a part of FIG. 2B. For example, it is an enlarged view of part B of FIG. 2B. In the scribe area b, a scribe pad (hereinafter referred to as a scribe PAD) 1, and a scribe ROM 2 are formed. The scribe PAD 1 consists of eight address and data ports, four control ports, a mode switch terminal, and an external reset terminal, and etc.

A Manchester coded signal is provided for the eight address and data ports and the four control ports. A mode switch signal is provided for the mode switch terminal. The external reset terminal is asserted or negated depending on the sequence described later. The Manchester coded signal is a logic change signal, and includes an edge which changes from "1" to "0" or from "0" to "1". For example, if "01" is used to recognize "0" and "10" is used to recognize "1", then the Manchester coded signal is "01011001" when the data of "0010" is input from the scribe PAD 1.

A write signal, a read signal, a 16-bit address input selection signal, and a synchronization signal are input to four control ports.

Figure 3B:
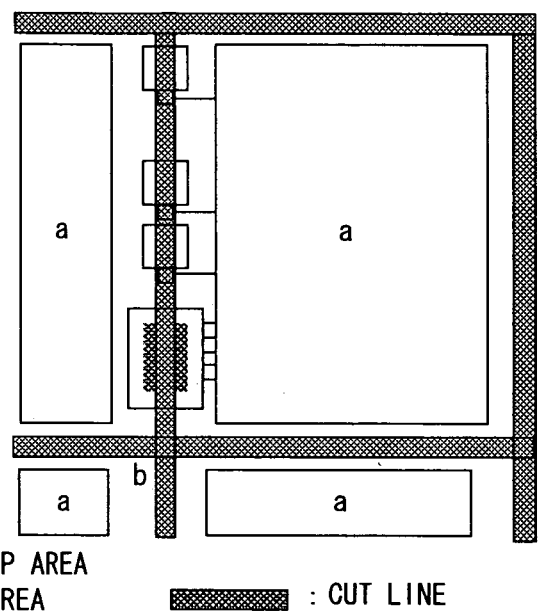
FIG. 3B shows the configuration of the dicing of a semiconductor wafer into chips and separating into a chip area and a scribe area.

The scribe ROM 2 stores a program for transition of a semiconductor chip to a test mode. The program also includes a program for generating a clock of dividing frequency used when the above-mentioned Manchester coded signal is decoded. Furthermore, FIG. 3 shows a dicing line as half-tone dot meshing when a semiconductor wafer is divided into chips. That is, the line displayed as half-tone dot meshing as shown in FIG. 3B is a cut line, and the scribe PAD 1 and the scribe ROM 2 are annihilated after the dicing.

FIG. 1 shows a practical circuit configuration of the chip area "a", and shows the configuration including the scribe PAD 1 and the scribe ROM 2. As shown in FIG. 1, the chip area includes a test circuit 3, a power-on reset circuit 4, a controller 5, ROM 6, a non-volatile memory 7, and a clock dividing circuit 8. The ROM 6 and the non-volatile memory 7 are tested by the testing circuit according to the present embodiment, and stored data is checked, etc. The power-on reset circuit 4 confirms the power supply to a chip and provides a reset signal for the test circuit 3 when the power supply is started.

The test circuit 3 consists of a mode register 10, a mode decoder 11, a test pad control 12, and an address and data selector 13. Each of the above-mentioned circuits in the test circuit 3 is connected to the controller 5, ROM 6, non-volatile memory 7, and clock dividing circuit 8 through an address bus and data bus.

Next, the processing operation using the above-mentioned configuration is explained below. When the process according to the present embodiment is performed, a necessary specimen is connected from the device not shown in the attached drawings to the scribe PAD 1 shown in advance in FIG. 1.

Figure 5:
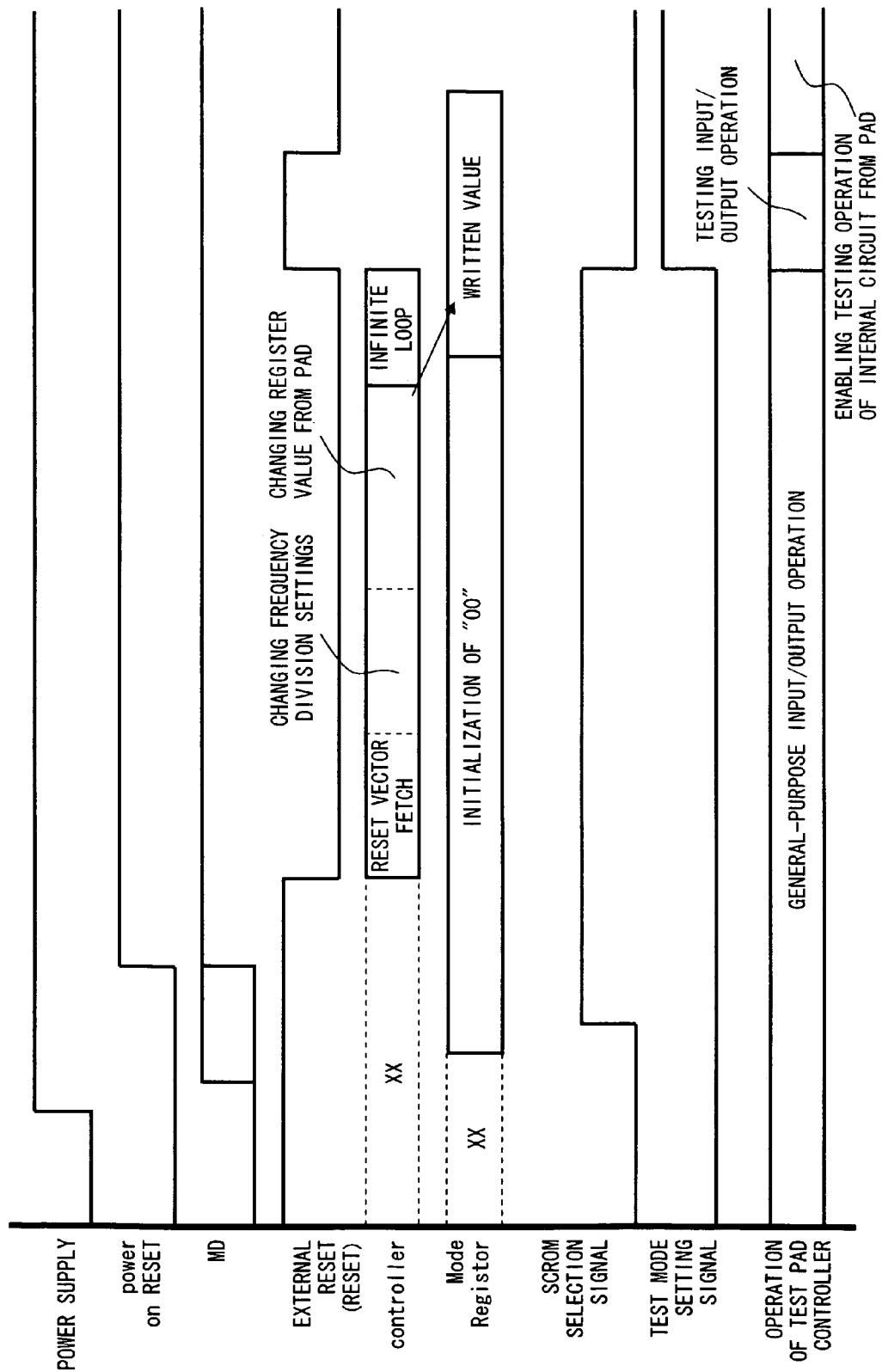
FIG. 5 is a timing chart explaining the process according to an embodiment of the present invention.

FIG. 4 is a flowchart explaining the process according to the present embodiment. FIG. 5 is a timing chart of a series of operations. In FIG. 1, First of all, the power supply is turned on to the chip "a". (S1).

Then, the mode switch terminal of the scribe PAD 1 is set to "1" (S2). When the input of the mode switch terminal is not switched, the transition to the test mode cannot be performed according to the present embodiment.

Next, when power is supplied in S1, and the reset of the power-on reset circuit is released (S3), the mode register 10 of the testing circuit is initialized, and, for example, the initial register value of "00" is set (S4).

Next, the controller 5 is activated (S6) when the setting of "1" of the mode switch terminal, and the initialization status of the mode register 10, and the external reset terminal are negated (S5) and a clock is provided. Then, a reset vector fetch is performed, and the address and data selector 13 selects the scribe ROM 2 of the scribe area b (S7) through the mode decoder 11, and the program of the scribe ROM 2 is activated (S8).

When the scribe ROM 2 is activated, the following item is performed. First, The change instruction of the setting of dividing frequency of the program is transmitted to the clock dividing circuit 8 through the internal bus, and the clock dividing circuit 8 generates a clock of dividing frequency of the period set by the program of the scribe ROM 2.

Next, the process of preparing a test set mode is performed (S9). After setting of dividing frequency, the test pad control 12 is initialized, and transits to the general-purpose input/output mode. At this time, the signal provided for the test direct terminal of the scribe PAD 1 inputs Manchester coded data. The input data is decoded by the test pad control 12, and the value of the register of mode register 10 can be rewritten through the internal bus of the chip. When the value of the register of mode register 10 is completely rewritten, the scribe ROM 2 program notifies the controller 5 of the infinitely looping operation, and the controller 5 performs an infinitely looping operation.

Next, the external reset terminal of scribe PAD 1 is asserted (S10). By the reset terminal's assert, the address and data selector 13 selects the test mode setting activation from the scribe ROM 2's program activation in the scribe area b from the value of the register of the mode register 10 through the mode decoder 11.

Furthermore, when the external reset terminal of the scribe PAD 1 is negated (S11), activation is performed by the settings written to mode register 10, a test mode setting signal is transmitted to the test pad control 12 through the mode decoder 11, the test pad control 12 is switched from the general-purpose input/output mode to the test input/output mode (S12), and a test from the test direct terminal of the scribe PAD 1 can be conducted (S13).

The signal from the test direct terminal of the scribe PAD 1 is a Manchester coded signal. The signal is decoded by test pad control 12. In the comparison of a test result, an output signal from the circuit in a chip is encoded by the test pad control 12 to a Manchester coded signal, and is output to the test direct terminal of the scribe PAD 1.

As described above, according to the present embodiment, since a Manchester coded signal is decoded, it is necessary to perform the process in synchronization with the clock of dividing frequency generated by the clock dividing circuit 8. The synchronization cannot be attained even by, for example, a third party externally inputting a similar signal, thereby preventing data from being decrypted or falsified.

Furthermore, when a semiconductor wafer is diced, not only the scribe PAD 1, but also the scribe ROM 2 is cut. Therefore, after shipping the semiconductor integrated circuit (chip), the transition to the test mode is almost impossible, thereby making it difficult to decrypt or falsify data.

In the present embodiment, a Manchester coded signal is explained as a signal output to the test direct terminal of the scribe PAD 1, but it is not limited to this use of the signal.

The testing circuit of the semiconductor device according to the present invention can conduct a test of a circuit in a chip other than memory not only by the test of the ROM 6 and the non-volatile memory 7, but also by the implementation of a secure and dedicated test mode.

As described above, according to the present invention, when a semiconductor wafer is diced, the ROM for transition to a test mode is also annihilated. Therefore, after shipping a semiconductor integrated circuit (chip), the transition to the test mode becomes impossible, thereby preventing data from being decrypted or falsified.

Furthermore, by using the logic signal of a Manchester coded signal, etc., and decoding a logic signal using a clock of dividing frequency generated based on the program stored in the storage device, transition to the test mode is impossible after product shipment, thereby preventing data from being decrypted or falsified.

What is claimed is:

1. A testing circuit for a semiconductor device, comprising of:

a pad formed in a cutting area of semiconductor wafer;

a storage device which is formed in the cutting area of the semiconductor wafer and stores a test mode transition program, the test mode transition program including an instruction for changing a dividing frequency; and a control circuit that is formed in a chip area of the semiconductor wafer, decodes a Manchester coded signal input from the pad, and sets the test mode by the program stored in the storage device, wherein the control circuit comprises:

a mode register in which the test mode is set;

a test pad control circuit configured to decode the Manchester coded signal based on the program which is stored in the storage device and to generate a dividing frequency clock used when the Manchester coded signal is decoded by dividing a clock based on the instruction transmitted from the storage device; and an address and data selector configured to switch access to the storage device.

2. The testing circuit of the semiconductor device according to claim 1, further comprising of:

a clock of dividing frequency generation circuit which is formed in a chip area of the semiconductor wafer and generates a dividing frequency clock on the clock based on the program stored in the storage device, wherein the logic signal is decodes in synchronization with the clock of dividing frequency.

3. The testing circuit of the semiconductor device according to claim 2, wherein a controlling process of the control circuit is performed through a controller formed in the chip.

4. The testing circuit of the semiconductor device according to claim 1, wherein an initialization signal is provided for the mode register when the chip area is powered up.

5. The testing circuit of the semiconductor device according to claim 1, wherein a controlling process of the control circuit is performed through a controller formed in the chip.

6. The testing circuit of the semiconductor device according to claim 1, wherein the address and data selector is configured to switch an access target between the storage device and a storage device in a chip area.

7. The testing circuit of the semiconductor device according to claim 1, wherein the pad and the storage device are annihilated by dicing the semiconductor wafer.

8. The testing circuit of the semiconductor device according to claim 1, wherein after setting the test mode, an external reset signal is provided from the pad, and the chip is tested.

9. A method for manufacturing a semiconductor device by setting a test mode of the semiconductor device wherein the semiconductor device communicates with a pad formed in a cutting area of a semiconductor wafer and a storage device formed in the cutting area and has a control circuit formed in a chip area, comprising:

selecting the storage device;

activating a program stored in the storage device according to a mode switch signal provided in the pad, the program including an instruction for changing a dividing frequency;

dividing a clock based on the instruction transmitted from the storage device in order to generate a dividing frequency clock;

decoding a Manchester coded signal provided for the pad based on the program stored in the storage device using the dividing frequency clock; and setting the test mode in a mode register of the control circuit formed in the chip area by decoding the Manchester coded signal provided for the pad.

10. The method according to claim 9, wherein the mode switch signal is provided after initializing a circuit in a chip upon power-up of the chip.

11. The method according to claim 9, wherein after setting the test mode, a reset signal is provided from the pad and the chip is tested.

12. A method for manufacturing a semiconductor device by setting a test mode, comprising:

forming a pad in a cutting area of a semiconductor wafer;

providing a storage device storing a program in the cutting area, the program including an instruction for changing a dividing frequency;

providing a control circuit in a chip area of the semiconductor wafers;

selecting the storage device;

activating the program stored in the storage device formed in the cutting area of a semiconductor wafer according to a mode switch signal provided in a pad formed in a cutting area of the semiconductor wafer;

dividing a clock based on the instruction transmitted from the storage device to generate a dividing frequency clock;

decoding a Manchester coded signal provided for the pad based on the program stored in the storage device using the dividing frequency clock; and setting the test mode in a mode register of a control circuit formed in the chip area by decoding the Manchester coded signal logic-signal provided for the pad.

13. The method of setting a test mode according to claim 9, further comprising:

generating the dividing frequency clock upon activation of the program.

* * * * *